(12) United States Patent
Cok

(10) Patent No.: US 7,973,470 B2
(45) Date of Patent: Jul. 5, 2011

(54) LED DEVICE HAVING IMPROVED COLOR

(75) Inventor: Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 537 days.

(21) Appl. No.: 12/037,116

(22) Filed: Feb. 26, 2008

(65) Prior Publication Data

US 2009/0212687 A1 Aug. 27, 2009

(51) Int. Cl.
*H01J 1/62* (2006.01)
(52) U.S. Cl. .................................. 313/506; 313/509
(58) Field of Classification Search .............. 313/506, 313/509
See application file for complete search history.

(56) References Cited

U.S. PATENT DOCUMENTS

| | | | |
|---|---|---|---|
| 5,405,710 A * | 4/1995 | Dodabalapur et al. ........ | 313/506 |
| 5,554,911 A | 9/1996 | Nakayama et al. | |
| 5,949,187 A | 9/1999 | Xu et al. | |
| 6,246,179 B1 * | 6/2001 | Yamada ........................ | 313/498 |
| 6,384,529 B2 | 5/2002 | Tang et al. | |
| 6,639,250 B1 * | 10/2003 | Shimoda et al. .............. | 257/98 |
| 6,680,570 B2 | 1/2004 | Roitman et al. | |
| 6,861,800 B2 | 3/2005 | Tyan et al. | |
| 6,919,681 B2 | 7/2005 | Cok et al. | |
| 6,987,355 B2 | 1/2006 | Cok | |
| 7,030,553 B2 | 4/2006 | Winters et al. | |
| 7,189,238 B2 | 3/2007 | Lombardo et al. | |
| 7,294,959 B2 * | 11/2007 | Cok et al. ..................... | 313/501 |
| 7,710,022 B2 * | 5/2010 | Cok et al. ..................... | 313/505 |
| 2005/0073228 A1 | 4/2005 | Tyan et al. | |
| 2005/0225232 A1 * | 10/2005 | Boroson et al. .............. | 313/504 |
| 2006/0066228 A1 | 3/2006 | Antoniadis et al. | |
| 2007/0057264 A1 * | 3/2007 | Matsuda ....................... | 313/114 |
| 2009/0015141 A1 * | 1/2009 | Wang et al. ................... | 313/504 |
| 2009/0072693 A1 * | 3/2009 | Cok et al. ..................... | 313/110 |

OTHER PUBLICATIONS

U.S. Appl. No. 11/856,121, filed Sep. 17, 2007, Cok et al.

* cited by examiner

*Primary Examiner* — Peter Macchiarolo
(74) *Attorney, Agent, or Firm* — Morgan, Lewis & Bockius LLP

(57) ABSTRACT

A display device includes a substrate having at least one light-emitting element. The light-emitting element includes one electrically-continuous electrode formed over the substrate. A separator is located on the electrically-continuous electrode, dividing the electrically-continuous electrode into at least first and second separate electrode portions that remain electrically continuous. A transparent layer is located over the first electrode portion, while separated from the second electrode portion. A light-emitting layer is formed over the transparent layer and the second electrode portion. A second electrode is formed over the light-emitting layer. The first electrode portion, the transparent layer, the light-emitting layer, and the second electrode comprise a first optical cavity having a first optical path length. The second electrode portion, the light-emitting layer, and the second electrode comprise a second optical cavity having a second optical path length different from the first optical path length.

20 Claims, 8 Drawing Sheets

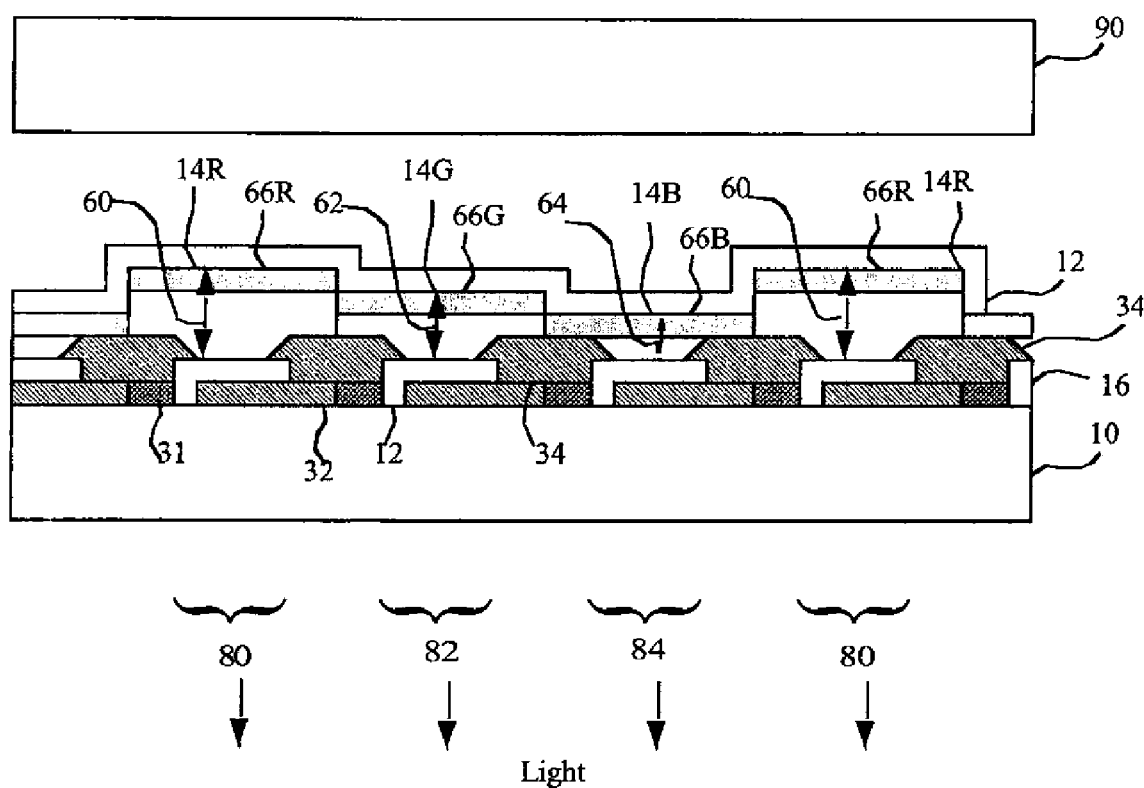
Fig. 8 - Prior Art

LED DEVICE HAVING IMPROVED COLOR

FIELD OF THE INVENTION

The present invention relates to light-emitting diode (LED) devices, and more particularly, to organic and inorganic LED device structures for improving light output, color, manufacturability, and angular performance.

BACKGROUND OF THE INVENTION

Emissive flat-panel display devices are widely used in conjunction with computing devices and in particular with portable devices. These displays are often used in public areas with significant ambient illumination and are viewed from a wide variety of angles. Such devices are also under development as area illumination devices or lamps.

Light-emitting diodes (LED) incorporating thin films of light-emitting materials have many advantages in a flat-panel display device and are useful in optical systems. Such films can comprise either, or both, organic and inorganic materials. U.S. Pat. No. 6,384,529 issued May 7, 2002 to Tang et al. shows an OLED color display that includes an array of OLED light emitting elements (pixels). Light is emitted from a pixel when a current is passed through an organic material, the frequency of the light depending on the nature of the organic material that is used. The organic materials are placed upon a substrate between electrodes, with an encapsulating cover layer or plate. In such a display, light can be emitted through the substrate (a bottom emitter) or through the encapsulating cover (a top emitter), or both. The emitted light is Lambertian, that is it is emitted equally in every direction. Because LED devices employ high-optical-index emissive materials, a large fraction (e.g. greater than 50%) of the emitted light is trapped in the device due to total internal reflection and thus reduces the device efficiency. Inorganic materials, for example, may include phosphorescent crystals or quantum dots. Other thin films of organic or inorganic materials may also be employed to control charge injection, transport, or blocking to the light-emitting-thin-film materials, and are known in the art.

Optical cavity structures are known to increase the light emitted from an LED device structure. Such optical cavity structures are also known as microcavities, or optical microcavities, when formed in thin films. When formed in LED devices, different color light-emitting organic materials are pattern-wise deposited over a substrate between a reflective electrode and a semi-transparent electrode. Light emitters having different colors are formed by depositing light-emitting organic or inorganic materials within an optical cavity that is tuned to a desired peak wavelength of light, typically corresponding to the color of light emitted by the patterned light-emitting materials. U.S. Pat. No. 6,680,570 describes an organic light-emitting device with improved color control employing spacer layers to form an optical cavity. FIG. 8 illustrates such a prior-art, active-matrix, bottom-emitting optical cavity device employing a substrate 10 with active-matrix thin-film components 31, planarization structures 32 and 34, and a semitransparent electrode 16. Patterned organic materials 14R, 14G, and 14B providing red, green, and blue light emission are deposited in a light-emitting layer 14. Optical spacers 66R, 66G, 66B are employed to form optical cavities 60, 62, and 64 tuned to the desired peak wavelengths of red, green, and blue light, respectively to emit red light 80, green light 82, and blue light 84. A cover 90 can be employed to protect and encapsulate the device. While such designs are useful, they require a patterned organic material deposition technology (for example, vacuum deposition through metal shadow-masks) that is difficult to scale to large substrates. Moreover, optical cavity devices typically suffer from an unacceptable angular color dependence. It is also known to employ a color filter with an optical cavity structure, for example as taught in U.S. Pat. No. 7,189,238. However, while useful, such an approach does not improve the manufacturability of the device and provides inadequate ambient contrast ratio under some illumination conditions. Moreover, the color filters absorb light emitted from the light-emitting layer, thereby reducing device efficiency.

U.S. Pat. No. 5,554,911 entitled "Light-emitting elements" describes a multi-color light-emitting element having at least two optical cavity structures with respectively different optical lengths determining their emission wavelengths. Each optical cavity structure includes an organic material as a light-emitting region, which may be a single film of uniform thickness in the element. U.S. Pat. No. 6,861,800 entitled, "Tuned microcavity color OLED display" describes a microcavity OLED device having an array of pixels divided into at least two different color pixel sets, each color pixel set emitting a different predetermined color light over a common substrate, wherein each pixel in the array includes a metallic bottom-electrode layer disposed over the substrate and a separate semitransparent metallic electrode layer spaced from the metallic bottom-electrode layer. The material for the semitransparent metallic electrode layer includes Ag, Au, or alloys thereof. The thickness of the semitransparent metallic electrode layer, the combined thickness of the organic layers and the transparent conductive phase-layer, and also the placement of the light-emitting layer are selected so that each pixel in the display forms a tuned microcavity OLED device having emission output efficiency above that of a comparable OLED device without the microcavity. U.S. Pat. No. 5,949,187 describes an OLED with a first microcavity including a first transparent spacer and a first mirror stack positioned on the first spacer to reflect light back into the OLED and to define an optical length of the first microcavity. The optical length of the first microcavity is such that light emitted from the first microcavity has a first spectrum. A second microcavity includes a second transparent spacer positioned adjacent the first microcavity and a second mirror stack positioned on the second spacer reflects light toward the second microcavity and defines an optical length of the second microcavity. The optical length of the second microcavity is such that light emitted from the second microcavity has a second spectrum. Additional microcavities can be placed in the structure to further enhance and alter the light spectrum. Such designs, however, may have increased manufacturing costs, lower light output than desired, and reflectance larger than may be desired, as well as significant color change at different viewing angles, owing to the change in the effective optical path length for light traveling at angles to the normal.

US 2006/0066228 A1 entitled, "Reducing or eliminating color change for micro cavity OLED devices", by Antoniadis discloses a microcavity OLED device that reduces color change at different viewing angles. The OLED device can be, for example, an OLED display or an OLED light source used for area illumination. This OLED device includes a multi-layer mirror on a substrate, and each of the layers is comprised of a non-absorbing material. The OLED device also includes a first electrode on the multi-layered first mirror, and the first electrode is substantially transparent. An emissive layer is on the first electrode. A second electrode is on the emissive layer, and the second electrode is substantially reflective and functions as a mirror. The multi-layer mirror and the second electrode form a microcavity. On a front surface of the substrate is a light modulation thin film. The light modulation thin film can be any one of: a cut-off color filter, a band-pass color filter, a brightness enhancing film, a microstructure that attenuates an emission spectrum at an angle at which there is a perceived color change, or a microstructure that redistributes wavelengths so the outputted emission spectrums have the same perceived color. Again such designs may have increased manufacturing costs due to patterned deposition processes. Also, significant light may be absorbed by the color filters thereby reducing efficiency.

One approach to overcoming material deposition problems on large substrates is to employ a single emissive layer, for example, a white-light emitter, together with color filters for forming a full-color display, as is taught in U.S. Pat. No. 6,987,355 entitled, "Stacked OLED Display having Improved Efficiency"by Cok. However, the use of color filters substantially reduces the efficiency of the device. It is also known to employ a white sub-pixel that does not include a color filter, for example as taught in U.S. Pat. No. 6,919,681 entitled, "Color OLED Display with Improved Power Efficiency" by Cok et al. However, this disclosure does not address angular color issues or the large amount of trapped light.

It is also known to produce white-light emission from a microcavity OLED device. US20050073228 A1 entitled, "white-emitting microcavity OLED device" describes a white light emitting OLED apparatus including a microcavity OLED device and a light-integrating element, wherein the microcavity OLED device has a white-light emitting organic EL element and the microcavity OLED device is configured to have angular-dependent narrow-band emission, and the light-integrating element integrates the angular-dependent narrow-band emission from different angles from the microcavity OLED device to form white-light emission. However, the color or white point of such a design has a strong angular dependence.

U.S. Pat. No. 7,030,553 entitled, "OLED device having microcavity gamut sub-pixels and a within gamut sub-pixel" by Winters et al discloses an example of a microcavity device. This disclosure describes an OLED device including an array of light-emitting pixels, each pixel including sub-pixels having organic layers including at least one emissive layer that produces light and spaced electrodes. There are at least three gamut sub-pixels that produce colors that define a color gamut and at least one sub-pixel that produces light within the color gamut produced by the gamut sub-pixels. At least one of the gamut sub-pixels includes a reflector and a semitransparent reflector, which function to form a microcavity. However, this design employs a patterned semi-transparent electrode to form the white subpixel that can be difficult to manufacture in a top-emitting format.

Co-pending, commonly assigned U.S. Ser. No. 11/856,121 describes the use of multiple optical cavities within a single, independently controlled pixel in an OLED device. However, applicants have demonstrated that, within an LED area-emissive display, the formation of adjacent film structures having significantly different thicknesses or sharp edges on a substrate, can cause electrical shorts in the device when films are not deposited over the edges. In the disclosure, there is no description of the means of making such a device to avoid such problems.

There still remains a need, therefore, for an improved light-emitting structure that overcomes shortcomings in the prior art and that increases the light output, angular color performance, and manufacturability of an LED device.

SUMMARY OF THE INVENTION

The present invention addresses the aforementioned need by providing a display device that includes a substrate having at least one light-emitting element. The light-emitting element includes one electrically-continuous electrode formed over the substrate. A separator is located on the electrically-continuous electrode, dividing the electrically-continuous electrode into at least first and second separate and electrically continuous electrode portions. A transparent layer is located over the first electrode portion, while separated from the second electrode portion. A light-emitting layer is formed over the transparent layer and the second electrode portion. A second electrode is formed over the light-emitting layer. The first electrode portion, the transparent layer, the light-emitting layer, and the second electrode comprise a first optical cavity having a first optical path length. The second electrode portion, the light-emitting layer, and the second electrode comprise a second optical cavity having a second optical path length different from the first optical path length.

ADVANTAGES

The present invention has the advantage that it increases the light output and manufacturability of an LED device, and reduces any angular color change.

BRIEF DESCRIPTION OF THE DRAWINGS

FIG. 8 illustrates a partial cross section of a prior-art bottom-emitter LED device.

The figures are not to scale, since the individual layers are too thin and the thickness differences of various layers too great to permit depiction to scale.

DETAILED DESCRIPTION OF THE INVENTION

Figure 1A:
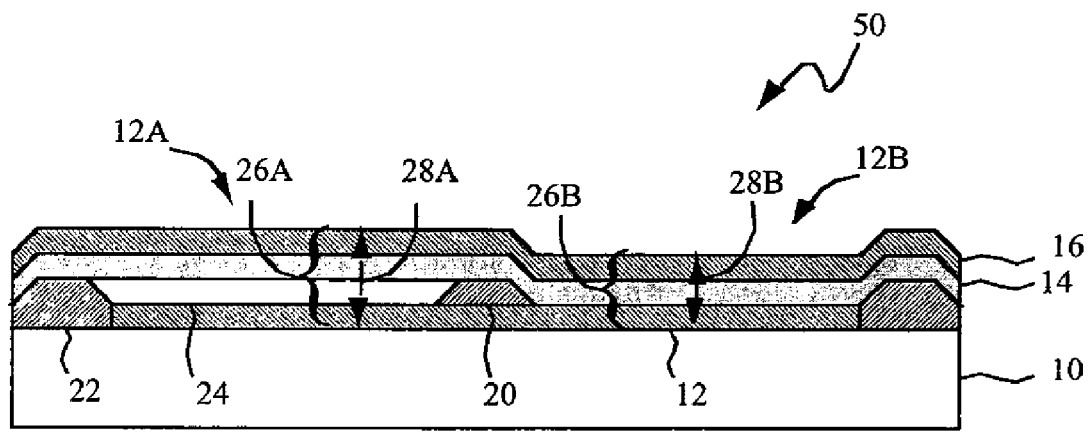
FIG. 1A illustrates a partial cross section of an LED device according to an embodiment of the present invention.
Figure 1B:
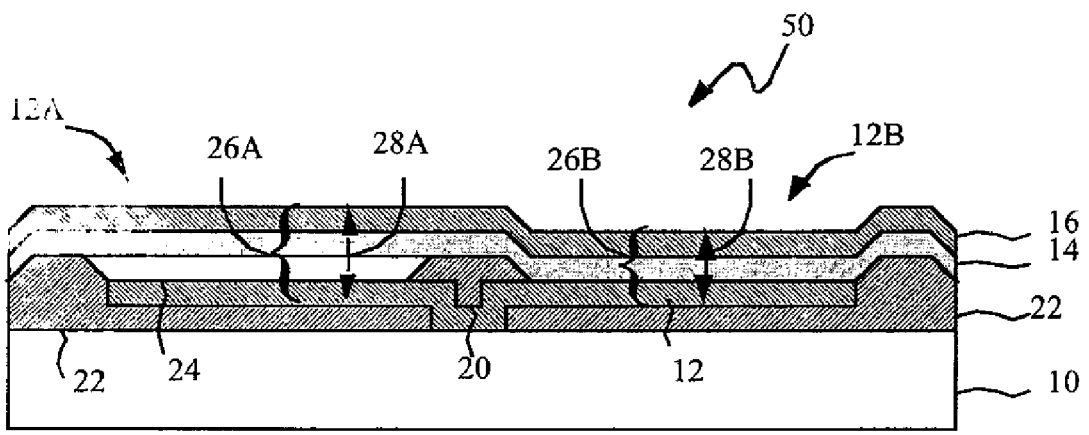
FIG. 1B illustrates a partial cross section of an LED device according to an alternative embodiment of the present invention.

Referring to FIGS. 1A and 1B, a display device according to an embodiment of the present invention comprises a substrate 10 having at least one light-emitting element 50, the light-emitting element 50 including one electrically-continuous electrode 12 formed over the substrate 10, a separator 20 located on the electrically-continuous electrode 12 dividing the surface of the electrically-continuous electrode 12 into first and second electrode portions 12A, 12B, the electrode portions 12A, 12B electrically continuous with each other, a transparent layer 24 located over the first electrode portion (e.g. 12A), the transparent layer 24 separated by the separator 20 from the second electrode portions, a light-emitting layer 14 formed over the transparent layer 24 and the electrode portion 12B, a second electrode 16 formed over the light-emitting layer 14, and wherein the first electrode portion 12A, the transparent layer 24, the light-emitting layer 14, and the second electrode 16 comprise a first optical cavity 26A having a first optical path length 28A and the second electrode portion 12B, the light-emitting layer 14, and the second electrode 16 comprise a second optical cavity 26B having a second optical path length 28B different from the first optical path length 26A. The separators 20 can be thicker than the transparent layer 24. Insulating layers 22 can be used to insulate components, separate electrodes, and form flat, smooth, planarizing surfaces on which to construct light-emitting layers 14. Because they are electrically continuous, the electrode portions 12A, 12B are commonly controlled. By electrically continuous is meant that any portion of the electrode 12 is electrically continuous with any other portion of the electrode (e.g. 12A, 12B), i.e. the separator 20 does not separate the electrode 12 into electrically discontinuous portions.

In various embodiments of the present invention, the light-emitting layer 14 can be unpatterned over the electrode 12 and substrate 10. In such an embodiment, the light-emitting layer 14 can emit white light that, in combination with color filters (not shown) comprise a full-color display device, for example with red, green, and blue sub-pixels. The light-emitting layer 14 may comprise organic materials deposited through evaporation, as is known in the art. Alternatively, the light-emitting layer 14 can include solution-deposited organic or inorganic materials, or a combination of organic and inorganic materials. In another embodiment of the present invention, the electrode 16 can be unpatterned over the substrate and the electrodes 12. Electrodes can be deposited, for example by sputtering or evaporation, as is known in the art.

In alternative embodiments of the present invention, one of the first or second electrode 12, 16 can be reflective and the other of the first or second electrode 12, 16 can be transparent or semi-transparent. For example, thin metal layers (e.g. comprising silver, aluminum, or magnesium or alloys thereof in layers less than 50 nm thick) can be sputtered or evaporated onto a surface to form semi-transparent electrodes. Alternatively, metal oxide materials, e.g. indium tin oxide (ITO) or aluminum zinc oxide, may be sputtered over a surface to form a transparent electrode. Reflective electrodes may be formed by sputtering or evaporating metal layers (e.g. comprising silver, aluminum, or magnesium or alloys thereof in layers greater than 50 nm thick) onto a surface. In other embodiments of the present invention, the transparent layer 24 can be electrically conductive, for example, by employing ITO to form the transparent layer 24. In one alternative embodiment, the transparent layer 24 is not conductive (e.g. comprising silicon oxides, silicon nitrides, or cured transparent resins) with an additional transparent, conductive layer (e.g. ITO, not shown) employed over the transparent layer 25 to provide electrical conductivity and current injection into the light-emitting layer 14. In yet another alternative embodiment the transparent layer 24 is organic and may comprise charge-control materials employed in OLED devices, e.g. NPB. In such an embodiment, the transparent layer 24 may be a thicker layer of a material (such as a hole-injection material) that is present in the OLED device. In this case, the material layer will have different thicknesses in the different electrode portions 12A and 12B to provide different cavity lengths.

Figure 4:
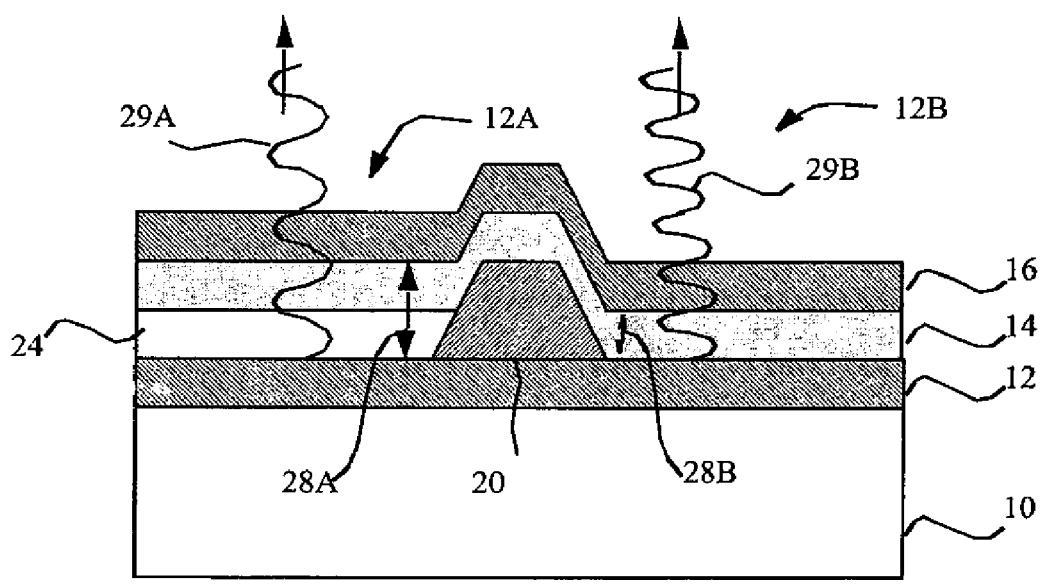
FIG. 4 illustrates optical microcavities having different resonant frequencies useful for various embodiments of the present invention.

The present invention can operate by providing a voltage difference across the electrodes 12 and 16 causing a current to flow through the light-emitting layer 14. In response to the current, the light-emitting layer 14 emits light that travels through the transparent or semi-transparent electrode and is emitted from the light-emitting element 50. The first optical cavity 26A having a first optical path length 28A constructively interferes with the emitted light to emit a greater amount of light of a desired frequency from the portion 12A of the electrode. Referring to FIG. 4, the second optical cavity 26B having a second optical path length 28B different from the first optical path length 28A constructively interferes with the emitted light to emit a greater amount of light of a different desired frequency 29B from the portion 12B of the electrode than light of the desired frequency 29A from the portion 12A. Because the same electrodes 12, 16 are employed to provide current to both portions 12A and 12B of the electrode 12, the light emitted from the portions 12A and 12B cannot be independently controlled. That is, the electrode 12 is electrically continuous over the portions 12A and 12B. However, varying the relative spatial area of the electrode portions 12A and 12B can control the relative amount of light of each desired frequency. As shown in FIG. 4, the area of electrode portion 12A is smaller than the area of electrode portion 12B. Hence, in one embodiment of the present invention, the first and second electrode portions 12A, 12B have different areas.

The combination of light emitted by the two electrode portions 12A, 12B can provide a visually white light. For example, if the first optical cavity 12A is tuned to emit a yellow light while the second optical cavity 12B is tuned to emit blue light, the combined appearance of the two complementary colors emitted by the two, differently-tuned optical cavities 26A, 26B can be white. To further improve performance of the light-emitting element 50, the light-emitting layer may emit light having a spectrum with multiple peaks at wavelengths corresponding to the multiple optical path lengths 28A and 28B. Furthermore, it is known that optical cavities tend to create a color dependence on viewing angle. By carefully selecting the optical cavity length and layer structure so that changes in each of the separate cavities are mutually compensating, the overall change in perceived color can be reduced.

Referring to FIG. 1A, the separator 20 may be located on top of an electrode 12, dividing the electrode 12 into two electrically continuous portions 12A and 12B. By electrically continuous is meant that electricity can flow directly from one portion of the electrode to the other. As shown in FIG. 1A, the electrode 12 and portions 12A, 12B are formed in a common plane. In an alternative embodiment, each portion 12A or 12B of the electrode 12 is formed in a common plane, but an electrically conducting portion of the electrode can be formed under the separator 20 as shown in FIG. 1B, electrically connecting portions 12A, 12B so that the separator is formed between separate electrode portions. Layers 22, for example, may be used to insulate components, separate electrodes, and form flat, smooth surfaces on which to construct light-emitting layers 14. As shown in FIG. 1A, insulating layer 22 separates electrode 12 from the electrode of a neighboring sub-pixel (not shown). Such a structure is particularly useful in a passive-matrix design and in a bottom-emitting device wherein electrode 12 is transparent or semi-transparent and electrode 16 is reflective. As shown in FIG. 1B, insulating layer 22 not only separates electrode 12 from the electrode of a neighboring sub-pixel (not shown), but provides a smooth, insulating surface on which to form electrode portions 12A and 12B. Such a structure is particularly useful in an active-matrix design and in a top-emitting device wherein electrode 16 is transparent or semi-transparent and electrode 12 is reflective. Such alternative structures can be useful in various manufacturing processes, in particular for connecting to thin-film electronic components (not shown), e.g. thin-film transistors, buss lines, etc. The present invention may be employed with both active- and passive-matrix devices.

Figure 1C:
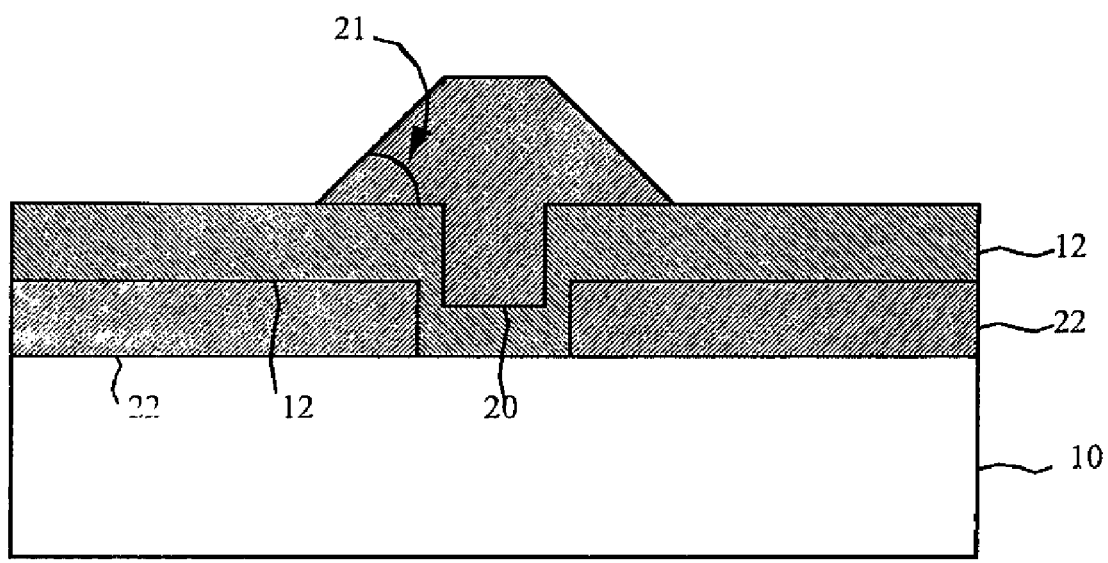
FIG. 1C illustrates an enlargement of the partial cross section of an FIG. 1B.

The separators 20 can be usefully structured to reduce sharp edges (and consequent electrical shorts between the electrodes 12 and 16). Referring to FIG. 1C, for example, the separators 20 can have edges that preferably form an angle 21 of less than 90 degrees with respect to the electrode surface where the separator 20 contacts the electrically-continuous electrode 12 surface. More preferably, this angle is less than 60 degrees, and most preferably less than 30 degrees. The absence of sharp edges in the light-emitting areas helps to ensure that the light-emitting layer 14 covers the surface evenly and completely and prevents voids that can form electrical shorts. Areas above the separator 20 itself are not of such great concern, since the separator is typically insulating and no shorts can occur through the separator 20.

While FIGS. 1A and 1B show the separator 20 in cross section separating the electrode 12 into two portions according to various embodiments of the present invention, the electrode 12 may be divided by one or more separators 20 into two, three, four, or more separated portions. Moreover, the portions can have different sizes (as shown later in FIG. 5). The electrode (e.g. 12) can be formed in one continuous plane with the separator(s) 20 formed over the plane or between separate portions of the plane. The separator can be formed from photo-sensitive resins, for example, using photolithographic techniques known in the art or from inorganic materials such as silicon oxides or silicon nitrides. The light-emitting materials comprising layer 14 can be organic and a display device employing the present invention can be an organic light-emitting diode display device. Alternatively, the light-emitting materials comprising layer 14 can be inorganic comprising phosphorescent crystals or quantum dots and the display device can be an inorganic light-emitting diode display device. The light-emitting layer 14 itself may include multiple layers of light-emitting materials or charge-control materials, as are known in the art. Some layers can, for example, comprising organic materials while others can comprise inorganic materials. Such layer structures and materials are included in the present invention.

Figure 2A:
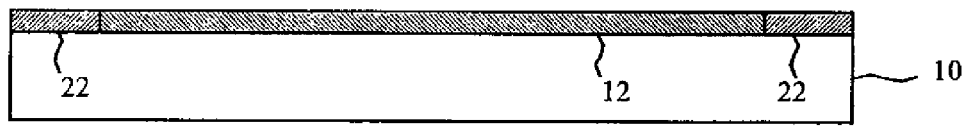
FIGS. 2A-2K illustrate successive steps in forming a top-emitter LED device according to an embodiment of a method of the present invention.
Figure 2B:
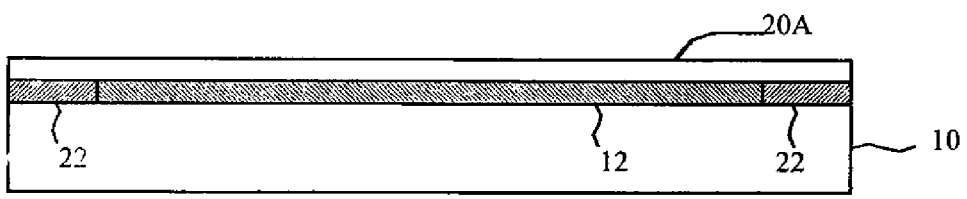
Figure 2C:
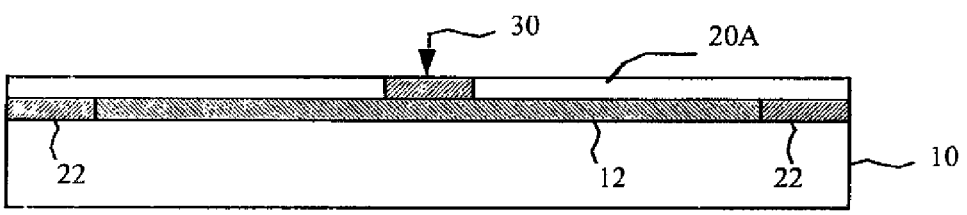
Figure 2D:
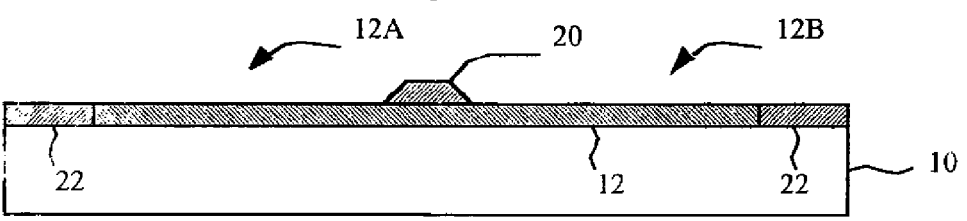
Figure 2E:
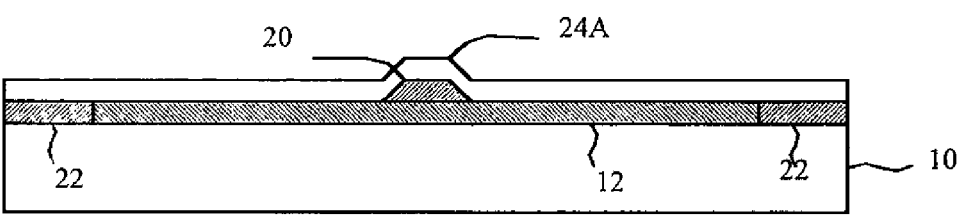
Figure 2F:
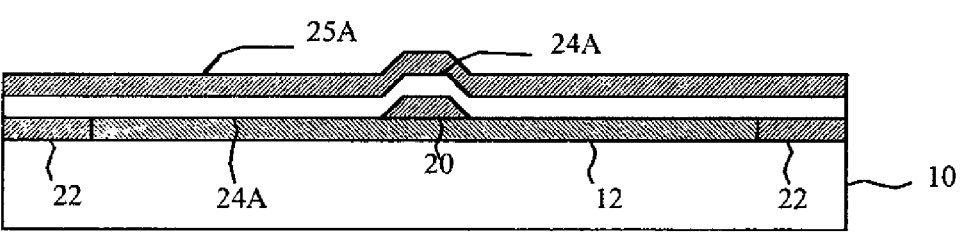
Figure 2G:
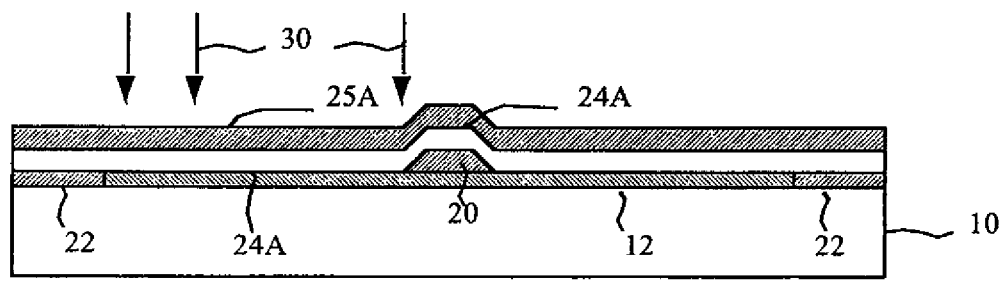
Figure 2H:
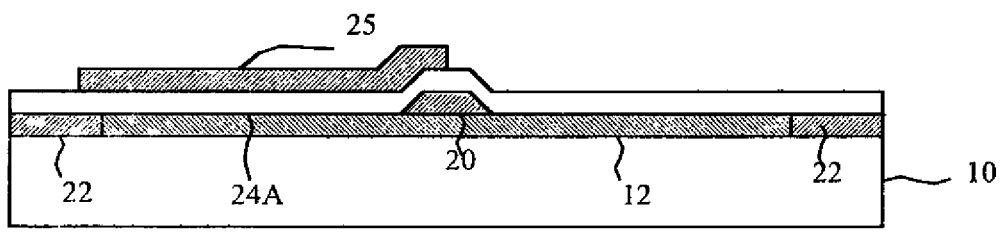

Referring to FIGS. 2A-2K, a method of forming a display can comprise the steps of providing a substrate 10 having at least one electrically-continuous electrode 12 formed over the substrate (FIG. 2A). Referring to FIG. 2B, a first photo-sensitive material 20A can be coated over the electrically-continuous electrode 12, pattern-wise exposing (FIG. 2C), for example with patterned light 30, and removing (FIG. 2D) portions of the first photosensitive material 20A to form a separator 20 that divides the surface of the electrically-continuous electrode 12 into two, or more, separate electrode portions 12A, 12B. Referring to FIG. 2E, a transparent layer 24A can be deposited over the separated electrode portions 12A, 12B. The patterned transparent layer may be deposited, for example by sputtering or evaporation, through a mask. Such a mask may be formed from a conventional metal shadow-mask, for example, and material comprising the transparent layer evaporated or sprayed through the mask. In an alternative process, the transparent layer 24 may be inkjet deposited and can comprise, for example, conductive or non-conductive polymer materials. The first electrode portion, the transparent layer, the light-emitting layer, and the second electrode comprise a first optical cavity having a first optical path length and the second electrode portion, the light-emitting layer, and the second electrode comprise a second optical cavity having a second optical path length different from the first optical path length.

Figure 2I:
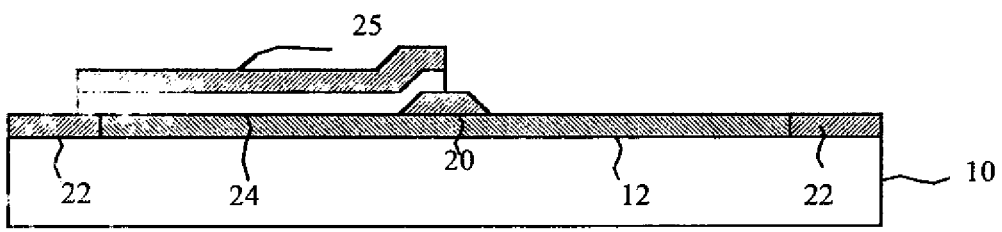
Figure 2J:
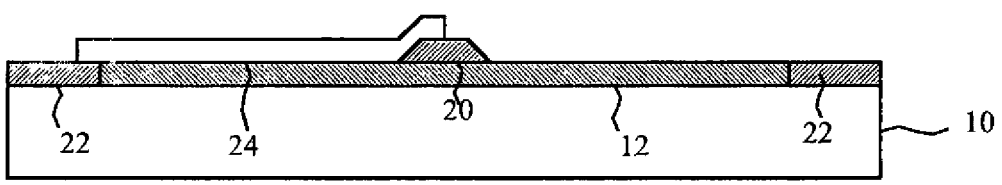

Alternatively, a second photosensitive material layer 25A can be deposited over the transparent layer 24A (FIG. 2F), pattern-wise exposed with patterned light 30 (FIG. 2G), and removed (FIG. 2H) to form a protective layer 25 over one electrode portion 12A. The second photosensitive material 25A is removed in an other electrode portion 12B to expose the transparent layer 24A in the other electrode portion 12B; the electrode portions 12A, 12B are separated by the separator 20. Referring to FIG. 2I, the exposed transparent layer 24A is then removed to form transparent layer 24 over electrode portion 12A. The remaining photosensitive material 26 is then removed (FIG. 2J). The various layers should comprise material that can be differentially etched, as is known in the art, to remove one layer while leaving other layers in place.

Figure 2K:
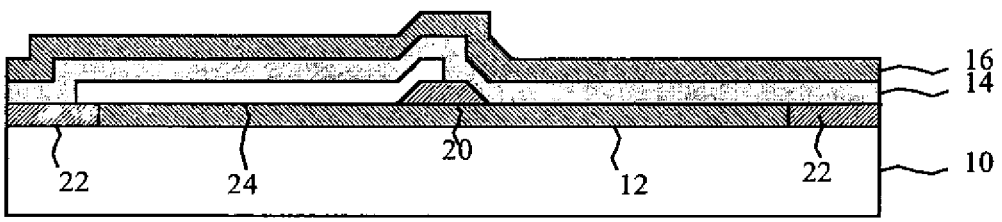

A light-emitting layer 14 is formed over the transparent layer 24 (FIG. 2K). Referring to FIG. 2K, a second electrode 16 is formed over the light-emitting layer 14. The second electrode 16 is unpatterned over the electrode 12 (as shown) and may be unpatterned over the extent of the substrate (i.e. over other sub-pixels). The two, or more, separate electrode portions 12A, 12B form at least a portion of two or more optical cavities having different optical path lengths.

Figure 6:
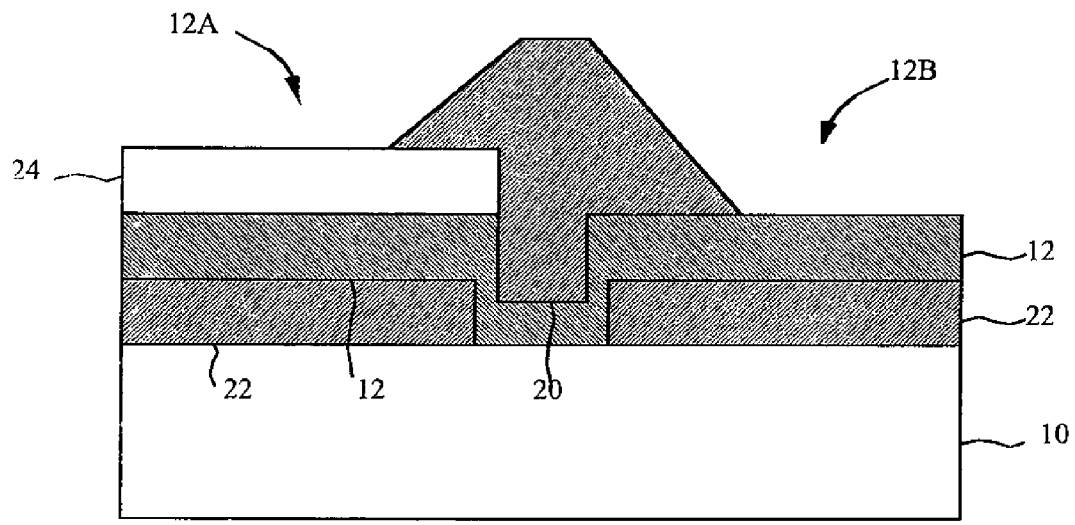
FIG. 6 illustrates a partial cross section of a device having a transparent layer in an alternative position according to an embodiment of the present invention.
Figure 7:
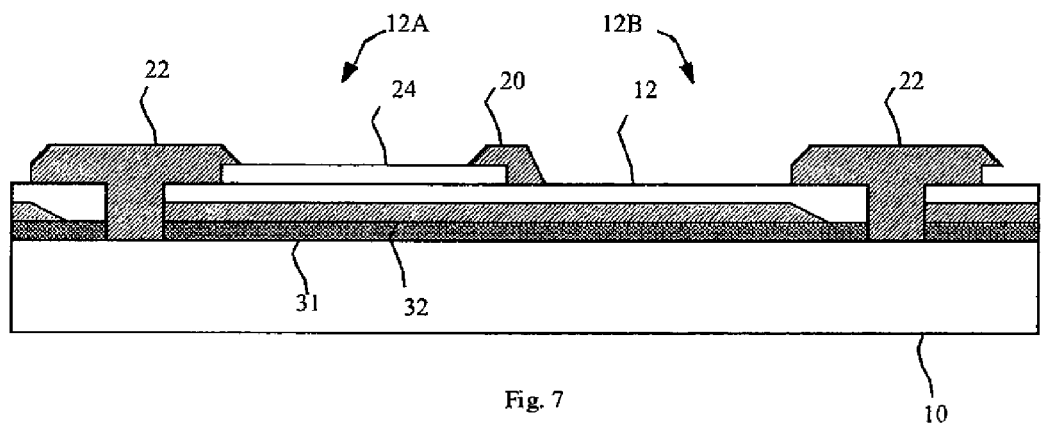
FIG. 7 illustrates a more-detailed partial cross section of a device having a transparent layer in an alternative position corresponding to FIG. 6 according to an embodiment of the present invention.

While the illustrations of FIGS. 2 and 3 locate the transparent layer 24 above or in the same plane as the separator 20 with separator 20 formed before the transparent layer 24, in an alternative embodiment of the present invention, the separator 20 is formed after the transparent layer 24. Referring to FIG. 6, the transparent layer 24 can be formed over an electrode portion 12A and the separator 20 formed over the transparent layer 24 to ensure that no sharp edges are exposed. Such structures can be formed using known photolithographic techniques and have been demonstrated by applicants. Referring to FIG. 7, in a more complete illustration of an embodiment of the present invention, a top-emitter OLED device is constructed on a substrate 10. Thin-film circuits 30 (e.g. comprising amorphous or polycrystalline silicon) are formed over the substrate and a first planarization and insulating layer 32 formed over the thin-film circuits 31 leaving exposed a connection to a reflective electrode 12 (e.g. comprising silver or aluminum) formed over the insulating layer 32 and thin-film circuits 31 A patterned, transparent layer 24 (e.g. comprising ITO) is formed over the reflective electrode 12, and a second insulating layer 22 formed between the reflective electrodes 12. The separator 20 can be formed in the same step and of the same materials. Light-emitting materials and the second electrode can then be deposited over the structure (not shown). Photolithographic processes known in the art may be employed to construct the structure.

According to various embodiments of the present invention, the first or second photo-sensitive material 20A, 26A can be a resin. Planarization and insulating layers 20 can also be employed to provide electrical insulation between sub-pixels in a device and to provide smooth surfaces on which to deposit light-emitting layers. The transparent layer 24 can be sputtered or evaporated, with or without a mask. If a mask is employed, the transparent layer can be formed directly. If a mask is not employed, the transparent layer 24 may be patterned using photolithographic methods known in the art. The photosensitive materials 20A, 26A can be removed by etching using photolithographic methods known in the art.

In further embodiments of the present invention, the transparent layer is electrically conductive, for example, comprising indium tin oxide sputtered over the electrode portions. Alternatively, aluminum zinc oxide or other metal oxides can be used.

Figure 3A:
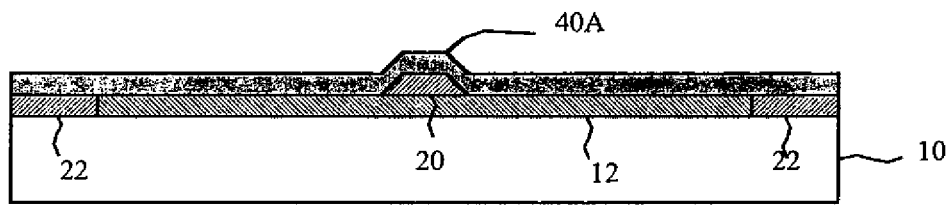
FIGS. 3A-3E illustrate successive steps in forming a top-emitter LED device according to an embodiment of an alternative method of the present invention.
Figure 3B:
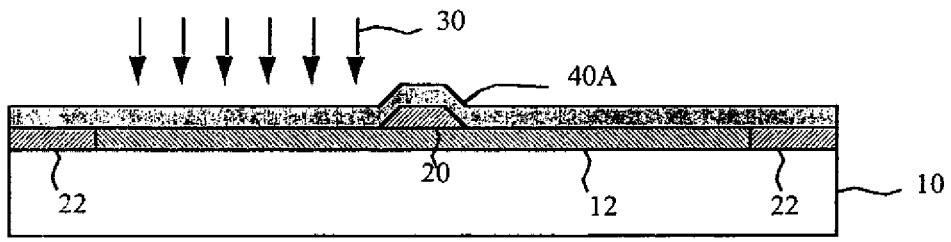
Figure 3C:
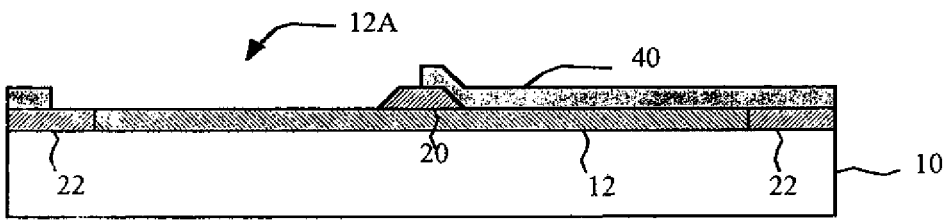
Figure 3D:
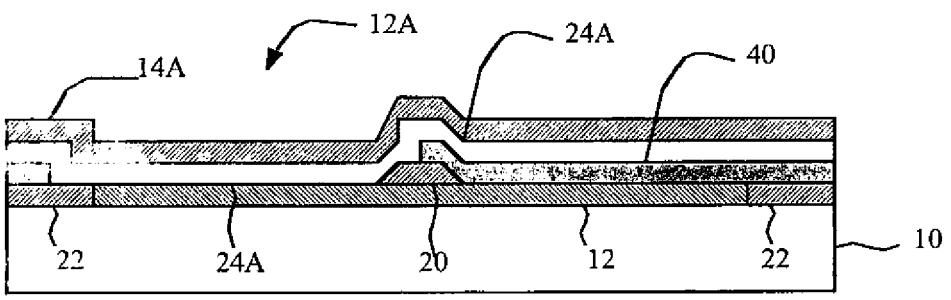
Figure 3E:
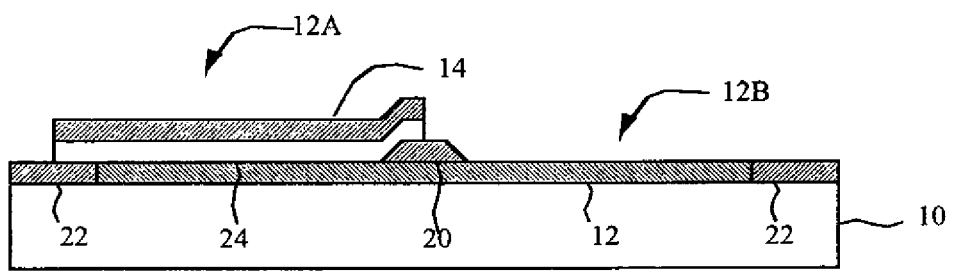

Referring to FIGS. 3A-3C, in an alternative method of forming a display, at least one electrically-continuous electrode 12 is formed over a substrate 10 (FIG. 3A) with portions separated by separators 20 (e.g. by the method shown in FIG. 2). A mask layer 40A is located or formed over the electrode 12 (FIG. 3B). Referring to FIG. 3B, a portion of the mask layer 40A is removed (for example by material ablation by patterned light 30) to form mask 40 and expose a portion 12A of the electrode 12. Referring to FIG. 3D, a transparent layer 24A is formed over the mask and exposed electrode portion, as well as a light-emitting layer 14A. Referring to FIG. 3E, the mask 40 is then removed and a second electrode formed (as shown in FIG. 2K). The electrode portion 12A, having the patterned transparent layer 24, forms part of a first optical cavity and the portion of the electrode 12B without the transparent layer forms part of a different optical cavity having a different optical path length than the first optical path length.

In various embodiments of the present invention, the mask can be a conventional metal shadow-mask or can be formed from a polymer film that is pattern-wise ablated to form a mask. Alternatively, the polymer film can be cut into separate sections (e.g. by ablation) and sections mechanically removed to form a mask. The transparent layer can be sputtered through the mask to form a patterned transparent layer. The patterned transparent layer may be electrically conductive, for example by employing metal oxides such as indium tin oxide, aluminum zinc oxide, or other transparent, conductive metal oxides. Applicants have demonstrated useful optical cavity structures employing transparent layers with thicknesses from 5 to 300 mm.

According to embodiments of the present invention, the light-emitting layer 14 can also be patterned by depositing the material comprising the light-emitting layer 14 through the mask 40 before it is removed, for example by evaporation or liquid coating. Alternatively, the light-emitting layer 14 can be deposited after the mask 40 is removed. A patterned light-emitting layer can be employed with different materials in each part of the pattern to emit colored light, thereby improving device efficiency and removing the need for a color filter.

The present invention provides a useful means to combine a display pixel design incorporating a white sub-pixel with a micro-cavity structure. Such a design is especially useful when employed with an unpatterned light-emitting layer (e.g. layer 14). Unpatterned light-emitting layers can be formed without expensive shadow-mask technology and on large substrate surfaces, thereby reducing the cost of manufacture and increase the size of devices that may be made. The use of a white sub-pixel increases the efficiency of the device since a white sub-pixel may not employ a color filter while other, color sub-pixels do employ light-absorbing color filters. Commonly assigned U.S. Ser. No. 11/842,229 describes such a device in greater detail and is hereby incorporated by reference in its entirety.

All of the thin-film layers can be formed on a substrate 10. The positions of the reflective, conductive thin-film structure 12 and the semi-transparent, conductive thin-film structure 16 with respect to the substrate 10 and a cover 20 may be reversed, to form a top-emitting or bottom-emitting LED device, both of which are contemplated by the present invention. The thin-film layers, together, can emit white light and can include a plurality of individual light-emitting layers, as is known in the art. However, when employed within a microcavity, the emission from the microcavity structure will be colored, due to the constructive and destructive optical interference caused by the microcavity structure.

To further understand this invention, it is useful to understand a number of the terms that are employed. A reflective thin-film structure will typically reflect at least 50% of the radiant energy for at least one desired wavelength or preferably reflect at least 80% of the radiant energy for at least one desired wavelength. However, it will be recognized that it is desirable for such a reflective thin-film structure to reflect even greater than 90% of the radiant energy. A semi-transparent conductive film of the present invention is desired, which has very low absorbance within a desired wavelength range. Such a layer will typically reflect at least 10% of the radiant energy that impinges on it and preferably may reflect significantly more of the radiant energy that impinges upon it over a desired wavelength range. When discussing a range of angles, such angles are typically measured with respect to a vector drawn normal to the substrate, which will often also be normal to the active region of the reflective conductive thin-film structure. Transparent layers are those which transmit at least 50% of incident light through the layer. Preferably transparent layers transmit more than 70%, more preferably 80%, and even more preferably 90%.

Further, within this disclosure, the term white refers to any color to which a human observer may adapt to and perceive as white. Such colors are often specified with respect to the Planckian Locus within a perceptually relevant color space, such as the 1976 CIE uniform chromaticity diagram. For the purposes of the present invention a color will typically be specified as white if it lies within 0.05 units of the Planckian Locus for blackbody temperatures between 3000 and 20,000 Kelvin when plotted within the 1976 CIE uniform chromaticity diagram.

While unpatterned, white-light emitters may be employed in the present invention, in other embodiments of the present invention the light-emitting layer can be patterned. For example, different light-emitting materials may be employed within different, commonly-controlled microcavity structures. In this case, each of the two or more commonly-controlled microcavity structures emit light having a smaller spectral range than the spectral range of the light-emitting thin-film layer(s). According to further embodiments of the present invention, the light emitted by at least two of the microcavity structures 28 is complementary. As used herein, complementary light means two frequencies, or frequency ranges, of light that together forms a white light, for example blue and yellow, or red and cyan, or green and magenta. For the case of magenta, an optical cavity may be resonant at both blue and red frequencies to emit light perceived as magenta light.

The present invention can be employed with, or without color filters or color filters patterned to correspond to the electrode portions.

According to one embodiment of the present invention, one electrode can be reflective and the second electrode can be semi-transparent; the electrodes can include a single layer, for example a metal layer such as aluminum, silver, magnesium, or alloys of these metals wherein the reflective electrode is much thicker than a semi-transparent electrode. Alternatively, one electrode can be transparent, e.g. comprising a transparent conductive oxide such as ITO, and one reflective, e.g. comprising a metal layer. In this latter case, optical cavity effects can be obtained through refractive index differences between the transparent electrode and an adjacent layer, for example comprising a gas or vacuum.

The present invention can be employed in an RGBW (red, green, blue, and white) sub-pixel architecture to form individual pixels in an information presentation device, such as a display. A common, unpatterned white-light emitter can be employed. Colored light is formed by a combination of separately tuned microcavities for each color together with color filters (for the color sub-pixels) while the white emitter can employ at least two separate microcavities without a color filter, as described above. A black matrix can be employed to absorb ambient light between the light-emitting elements. Planarizing and insulating layers can be provided to electrically separate the independently-controllable light-emitting sub-pixels. When employed for white emission, a color filter may not be necessary for the commonly-controllable electrode structures of the present invention since the optical microcavities can form complementary colors. However, in another embodiment of the present invention and as described below, one or more separate color filters can also be employed.

Alternatively, the present invention can be employed to form an area illumination device or lamp. In this latter case, emission at a wide variety of frequencies is necessary to provide a high color rendering index (CRI). Hence, employing complementary color pairs having a widely distributed set of frequencies can provide a high-quality white-light source. Such displays, area illuminators, or lamps can be employed in a light-emission system that includes an LED device together with a controller to control and provide power to the thin-film, light-emitting diode device (e.g. emitting white light), typically through the reflective, conductive electrode 12 and semi-transparent, conductive electrode 16, which are typically current-carrying electrodes, in response to an information or power signal.

Prior-art light-emitting solutions employing thin-film optical cavity structures suffer from a poor white emission and, in particular, a strong tendency to change color when viewed at a variety of angles. As taught in the present invention, however, the commonly-controlled microcavity structures 26 emit light having a smaller spectral range than the spectral range of the white-light-emitting thin-film layer(s) 14. The combination of light emitted by the microcavity structures 26, being substantially white, and the color change of the combined light emitted by the microcavity structures 26, at a range of angles, is less than the color change of the light emitted by at least one of the microcavity structures 26 at the range of angles. Therefore, the present invention provides thin-film optical cavity structures that produce white light with a decreased dependence on angle.

In this disclosure, complementary wavelengths of light are those wavelengths of light that, when viewed together, form a substantially white-appearing light, such as light on or near the Planckian locus. For example, blue and yellow form a complementary pair, as do cyan and red, and green and magenta. Hence, the commonly-controllable optical microcavities of the commonly-controllable electrode of a white sub-pixel, when viewed together, emit apparently white light. According to various embodiments of the present invention, the commonly-controlled microcavities are not individually distinguished by the human eye when viewed from a typical viewing distance, for example the commonly-controllable electrode portions of a white sub-pixel. Hence, the light emitted from a white sub-pixel will be viewed as white, even though the light emitted from the white sub-pixel can be a combination of complementary colors.

In operation, current, for example, as supplied through thin-film transistors, passes through the light-emitting layer via the thin-film, conductive electrodes 12 and 16, causing light to be emitted. Some of the emitted light passes directly out of the device or through color filters and out of the device. Other light is reflected from the reflective electrode 12 and passes out of the device. Other light, emitted at a higher angle to the normal, is trapped via total internal reflection. The optical cavity structures of the present invention serve to reduce the angle of emission of the emitted light, thereby reducing the amount of trapped light and also focusing more of the desired light in the forward direction. Commonly-controllable microcavity structures of a white sub-pixel are driven at the same time with the same electrical controls (e.g. transistors or passive-matrix busses) so that they cannot be independently stimulated and, hence represent one sub-pixel, albeit one having a plurality of different optical components. The optical components may provide a combined, perceptually white light that has reduced perceived color shift with angle compared to the perceived color shift with angle of one or more of the different optical components. The present invention may be employed with both active-matrix and passive-matrix control circuits. It should be noted that the relative sizes of the electrode portion 12A, 12B may be adjusted during design and manufacturing, at least in some embodiments, to tune the color of light emission.

In particular, the present invention provides a means to form a substantially white light that is viewed as white at a variety of angles from the normal. The light output from each optical microcavity 26A, 26B increases in frequency (and decreases in wavelength) as the angle at which the light is emitted increases from the normal (90 degrees) with respect to the substrate. According to the prior art, a conventional, single-element white emitter would tend to become substantially bluer and, especially greener, since the human visual system is most sensitive to green and all of the frequencies of white light emitted by the white sub-pixel are increased at the increased viewing angle with respect to the normal. However, according to the present invention, the different optical microcavities can mutually compensate for this effect. More precisely, the wavelength of the light emitted from each of the commonly-controlled electrode portions 12A, 12B changes at different viewing angles while the white-point changes of the combined light emission from the commonly-controlled electrode portions 12A, 12B is smaller than the white-point change due to the wavelength change of at least one of the commonly-controlled electrode portions 12A, 12B.

A large variety of white-light-emitting materials may be employed in concert with the present invention, together with a wide selection of optical cavity sizes. In one embodiment of the present invention, one of the commonly-controlled electrode portions 12A, 12B emits substantially blue or cyan light at a normal angle with respect to the substrate and another of the commonly-controlled electrode portions emits substantially yellow, orange, or red light at a normal angle with respect to the substrate. One of the commonly-controlled electrode portions emits light having a peak wavelength emission greater than 550 nm at a normal angle with respect to the substrate and another of the at-least-two commonly-controlled electrode portions emits light having a peak wavelength emission less than 500 nm at a normal angle with respect to the substrate. In other embodiments, the optical micro-cavities are tuned to emit red, green, and blue light, or yellow and blue light, or red and cyan light, or orange and cyan light or magenta and green light. In particular, one of the commonly-controlled electrode portions is tuned to emit light having a peak wavelength greater than 550 nm at a normal angle and may include a color filter formed over the commonly-controlled electrode portion, the color filter absorbing a substantial amount of the light having a wavelength less than 550 nm.

The light emission from the optical cavities of the present invention are increased by matching the spectrum of the light-emitting material, the color filter peak transmissions, and the optical microcavity response. That is, the optical microcavities are tuned to one or more peak wavelengths approximately corresponding to the peak emission wavelengths of the light-emitting layer. Similarly, the peak emission wavelengths of the white-light-emitting layer are matched to the peak transmission wavelength of the corresponding color filter, if employed.

It may also be possible to design a system in which the normal emission of the white sub-pixel is at a specific white point, such as D65. However, it is possible that the color change with viewing angle or average emission from a desired white point of such a design can be greater than an alternative design in which the emission stays closer to a desired white point or has a reduced change in white point with changing viewing angle, but never actually emits light at the desired white point. Such a design, in which the average performance is superior, may be desired. By average emission is meant the average white point for all of the viewing angles of interest, either weighted or unweighted by importance in an application. Hence, a preferred design may tune the emissions of the electrode portions to minimize the difference between the average emission and a preferred device white-point at more than one angle; rather than to match a desired white point at a single viewing angle.

A variety of light-emitting materials are employed in the present invention. For example, the white-light-emitting layer can include organic materials such as small-molecule organic or polymer materials or inorganic quantum dots formed in a poly-crystalline semiconductor matrix. Conventional photolithographic techniques can employed to form control structures (e.g. busses, transistors, capacitors, electrodes) on a substrate as well as forming transparent layers suitable for defining optical cavities. Suitable cavity-defining transparent materials can include, for example, silicon dioxide or indium tin oxide. Organic materials are deposited by various means known in the art, for example, vacuum evaporation. However, such means provide sufficient precision and accuracy to enable the consistent manufacturing of the optical cavities. In particular, the Kodak Vapor Injection System™ is an organic vacuum evaporation source, providing deposition of organic layers to within 1% uniformity and accuracy, may be usefully employed. Suitable semi-transparent cathodes may be formed by evaporation or sputter techniques known in the art, for example, silver, magnesium, aluminum or other metals or metal alloys. These semi-transparent electrodes will typically have a reflectance of greater than 20% and will ideally have an absorbance of less than 10%. Encapsulation techniques for both organic and inorganic materials useful for the present invention are known in the art. The present invention may be employed with various elements, such as circular polarizer, suitable for improving device ambient contrast ratio. In one embodiment, the present invention is a top-emitter device. In an alternative embodiment, the device is a bottom-emitter device.

Through consumer research and optimization of white-light emitters and with carefully selected optical cavity choices, applicants have demonstrated that the color change in white-light emitters using optical microcavities of the present invention are acceptable to consumers, as described in the afore-mentioned references. Such microcavity structures have advantages, particularly in top emitter configurations, since a semi-transparent electrode (for example, comprising a thin layer of silver) is much more electrically conductive than a fully transparent electrode (for example, comprising a transparent conductive oxide such as indium tin oxide). The present invention provides improved light output from the microcavity structure, reduced angular color shift, and reduced costs when employing an unpatterned light-emitting layer, either organic or inorganic.

In a patterned device, different materials are employed to emit light of different colors in response to current. In contrast, in an unpatterned device, the same materials are employed to emit a single color, for example, white, and the light emitted by the color sub-pixels is colored by employing color filters in combination with the white-light emitter. Often, a white-light emitter will include a combination of materials in one or more unpatterned layers that each emit a different color, for example, blue and yellow or red and cyan, to emit a light that is perceived, overall, to be white. An important point is that however many light-emitting materials are included in a single layer, or however many layers are included, the layers are unpatterned and their aggregate emission employed in all of the sub-pixels in all of the pixels.

It is known in the prior art that, in LED devices, light can be trapped by total internal reflection in the high-optical-index layers that actually emit light, or high-optical index charge-control layers, or high-optical index transparent electrodes. Light emitted at low angles to the normal can be emitted from the device, while light emitted at a relatively higher angle to the normal can be trapped in the high-optical-index layers. By employing an optical cavity structure, the emission of light at high angles is reduced, so that more light is emitted from the device at relatively lower angles to the normal.

Figure 5:
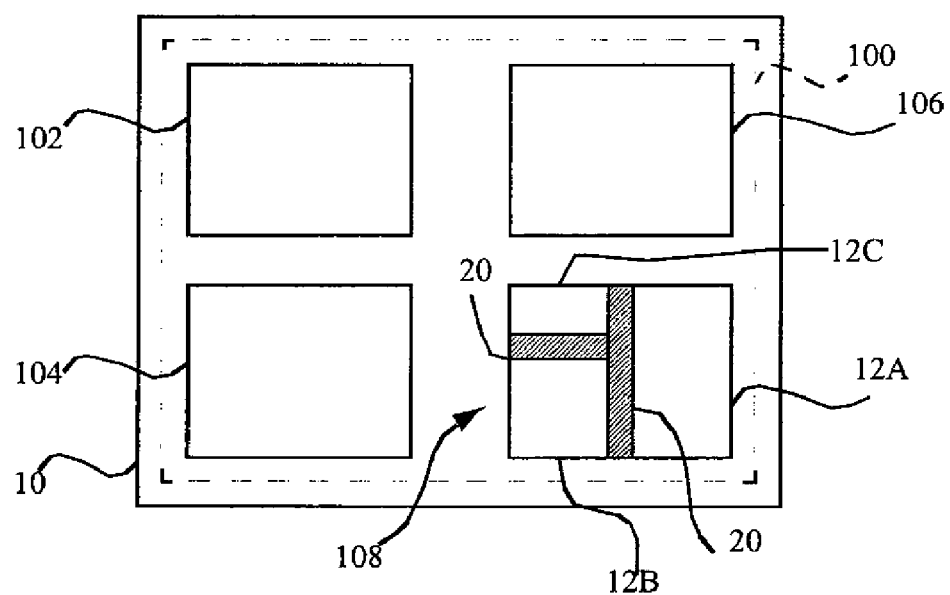
FIG. 5 illustrates a partial top view of an RGBW display device employing an electrode with three portions having optical microcavities with different resonant frequencies according to an embodiment of the present invention.

LED devices can be constructed with patterned light emitters that emit different colors (typically three, red, green, and blue) of light in different locations, corresponding to sub-pixels in a pixel. However, such patterning can be difficult and expensive, particularly for evaporated materials such as those employed with small-molecule OLED materials. Hence, an unpatterned white-light emitting layer can be employed with color filters to form the colored sub-pixels. However, this design can be relatively inefficient compared to patterned designs since the color filters absorb approximately two thirds of the light. By employing a fourth, white sub-pixel without color filters, neutral colors in an image can be rendered more efficiently. Referring to FIG. 5, such a red, green, blue, and white (RGBW) design employing optical cavities can be constructed on a substrate 10 having a pixel 100 with a green 102, red 104, blue 106, and white 108 sub-pixels. The white sub-pixel 108 has separators 20 dividing the sub-pixel into portions 12A, 12B, and 12C, each of which define different optical cavities tuned to different resonant frequencies. The colored sub-pixels 102, 104, and 106 may also employ optical cavities to increase the quantity and purity of the light emitted. The optical cavities of the white sub-pixel 108 can be the same as those of the colored sub-pixels 102, 104, and 106, or they may differ.

Applicants have constructed numerous OLED devices employing microcavities, both with patterned, colored emitters and with white emitters and have studied their performance together with the performance of circular polarizers and color filters, as described in the afore-mentioned references. Moreover, optical modeling tools have been employed to understand the performance of the present invention under a variety of circumstances. In general, a white-light-emitting, unpatterned OLED device employing an optical cavity and color filters can be expected to roughly double the light output of the colored pixels in comparison to a white-light-emitting, unpatterned OLED device without an optical cavity and color filters. The color sub-pixels will increase in light output the most, while the white-light-emitting sub-pixel will only change in light output by a multiplicative factor of roughly 0.6 to 1.2, since it is more difficult to increase broadband light output than narrow-band light in an optical cavity structure. However, since the white-light-emitting sub-pixel is more efficient (by about a factor of three) than the color sub-pixels (since no color filters are employed in the white sub-pixel), the use of a white sub-pixel improves the overall performance of an OLED device as most images have few saturated colors and the more-efficient white-light emitter is used disproportionately. Applicants have demonstrated that the use of such a white sub-pixel in a color filter design can improve the overall device performance by a factor of approximately two for some imaging applications.

LED devices of this invention can employ various well-known optical effects in order to enhance their properties if desired. This includes optimizing layer thicknesses to yield maximum light transmission, providing dielectric mirror structures, providing anti-glare or anti-reflection coatings over the display, providing neutral density, or providing color conversion filters over the display. Filters, polarizers, and anti-glare or anti-reflection coatings can be specifically provided over the cover or substrate.

The present invention can be practiced with either active- or passive-matrix OLED devices, and is particularly useful in information-display devices. In one embodiment, the present invention is employed in a flat-panel OLED device composed of small-molecule or polymeric OLEDs as disclosed in, but not limited to, U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including both active- and passive-matrix displays having either a top- or bottom-emitter architecture.

The invention has been described in detail with particular reference to certain preferred embodiments thereof, but it will be understood that variations and modifications can be effected within the spirit and scope of the invention.

PARTS LIST 10 substrate
12 electrically-continuous reflective conductive electrode
12A, 12B, 12C electrode portions
14 light-emitting layer(s)
14R, 14G, 14B patterned light-emitting layer(s)
16 transparent or semi-transparent conductive electrode
20 separator
20A separator layer
21 angle
22 planarization and/or insulating layer
24 patterned transparent layer
24A transparent layer
25 protective layer
25A photo-sensitive layer
26A, 26B optical cavities
28A, 28B optical path length
29A, 29B frequency of light
30 patterned light
31 thin-film circuitry
32 planarization and/or insulating layer
34 planarization and/or insulating layer
40 mask
40A mask layer
50 light-emitting element
60, 62, 64 optical cavity
66R, 66G, 66B optical spacers
80, 82, 84 light
90 cover
100 pixel
102 green sub-pixel
104 red sub-pixel
106 blue sub-pixel
108 white sub-pixel

The invention claimed is:

1. A display device, comprising:
  a) a substrate having at least one light-emitting element, the light-emitting element including one electrically-continuous electrode formed over the substrate;
  b) a separator located on the electrically-continuous electrode dividing the electrically-continuous electrode into at least first and second separate and electrically continuous electrode portions;
  c) a transparent layer located over the first electrode portion, the transparent layer separated by the separator from the second electrode portion;
  d) a light-emitting layer formed over the transparent layer and the second electrode portion;
  e) a second electrode formed over the light-emitting layer;
  f) an insulating layer formed on the substrate which separates the electrically-continuous electrode from neighboring electrically-continuous electrode of a corresponding neighboring light-emitting element; and
  g) wherein the first electrode portion, the transparent layer, the light-emitting layer, and the second electrode comprise a first optical cavity first optical path length; and the second electrode portion, the light-emitting layer, and the second electrode comprise a second optical cavity having a second optical path length different from the first optical path length.

2. The display device of claim 1, wherein the first and second electrode portions have different spatial areas.

3. The display device of claim 1, wherein the transparent layer is electrically conductive.

4. The display device of claim 1, wherein the light-emitting layer emits light with a spectrum having multiple optical peaks at wavelengths corresponding to the multiple optical path lengths.

5. The display device of claim 1, wherein the separator has edges with a maximum angle of 60 degrees with respect to the surface of the electrically-continuous electrode where the separator contacts the electrically-continuous electrode.

6. The display device of claim 1, wherein the separator divides the electrically-continuous electrode into two or three portions.

7. The display device of claim 1, wherein the electrically-continuous electrode portions are formed in a common plane with the separator formed over the common plane or between separate electrode portions.

8. The display device of claim 1, wherein the separator includes a photo-sensitive resin.

9. The display device of claim 1, wherein the light-emitting layer comprises organic materials or the light-emitting layer comprises inorganic including phosphorescent crystals or quantum dots.

10. A method of forming a display, comprising the steps of:

a) providing a substrate having at least one electrically-continuous electrode formed over the substrate;
b) depositing a first photosensitive material over the electrically-continuous electrode, patternwise exposing, and removing portions of the first photosensitive material to form a separator that divides the surface of the electrically-continuous electrode into two, or more, separate electrode portions;
c) forming a patterned transparent layer over at least one of the separated electrode portions;
d) forming a light-emitting layer over the transparent layer and all separated electrode portions;
e) forming a second electrode over the light-emitting layer;
f) forming an insulating layer on the substrate that separates the electrically-continuous electrode from neighboring electrically-continuous electrode of a corresponding neighboring light-emitting element; and
g) wherein one electrode portion, the transparent layer, the light-emitting layer, and the second electrode comprise a first optical cavity having a second electrode comprise a second optical cavity having a second optical path length different from the first optical path length.

11. The method of claim 10, wherein the step of forming the patterned transparent layer over the separated electrode portions comprises the steps of:
i) depositing a transparent layer over the separated electrode portions;
ii) depositing a second photosensitive material over the transparent layer, patternwise exposing, and removing the second photosensitive material to form a protective layer over a first electrode portion and removing the second photosensitive material in a second electrode portion to expose the transparent layer in the second electrode portion, each electrode portion separated from other electrode portions by the separator;
iii) removing the exposed transparent layer to form a patterned transparent layer.

12. The method of claim 10, wherein the step of forming the patterned transparent layer over the separated portions comprises the step of depositing a transparent layer over at least one of the separates electrode portions through a mask.

13. The method of claim 10, wherein the transparent layer is sputtered.

14. The method of claim 10, wherein the transparent layer is electrically conductive.

15. A method of forming a display, comprising the steps of:
a) providing a substrate having at least one electrically-continuous electrode formed over the substrate, the electrically-continuous electrode divided into separate portions by a separator;
b) locating or forming a mask over the electrically-continuous electrode;
c) removing a portion of the mask to expose at least one separate portion of the electrically-continuous electrode;
d) depositing a transparent layer over the mask and exposed electrode portion to pattern the transparent layer;
e) forming a light-emitting layer over the patterned transparent layer and electrically-continuous electrode;
f) removing the mask;
g) forming a second electrode over the light-emitting layer;
h) forming an insulating layer on the substrate that separates the electrically-continuous electrode from neighboring electrically-continuous electrode of a corresponding neighboring light-emitting element; and
i) wherein the separated electrically-continuous electrode portion having the transparent layer comprises a first optical cavity and the separated portion of the electrically-continuous electrode without the transparent layer comprises a second optical cavity having a different optical path length than the optical path length.

16. The method of claim 15, wherein the mask is a polymer mask.

17. The method of claim 15, wherein the transparent layer is sputtered.

18. The method of claim 15, wherein the removal of a portion of the mask to expose a separated portion of the electrically-continuous electrode is ablation.

19. The method of claim 15, further comprising the steps of:
separating the mask into portions and mechanically removing one of the portions of the mask to expose a separated portion of the electrically-continuous electrode.

20. The method of claim 15 wherein the light-emitting layer is deposited using either evaporation or liquid coating.

* * * * *